United States Patent
Allali et al.

(10) Patent No.: US 11,950,388 B2
(45) Date of Patent: Apr. 2, 2024

(54) ELECTRONIC BOARD FOR VOLTAGE CONVERTER

(71) Applicant: VALEO SYSTEMES DE CONTROLE MOTEUR, Cergy Pontoise (FR)

(72) Inventors: Nicolas Allali, Cergy Pontoise (FR); Emmanuel Talon, Cergy Pontoise (FR)

(73) Assignee: VALEO SYSTEMES DE CONTROLE MOTEUR, Cergy Pontoise (FR)

( * ) Notice: Subject to any disclaimer, the term of this patent is extended or adjusted under 35 U.S.C. 154(b) by 225 days.

(21) Appl. No.: 17/640,761

(22) PCT Filed: Sep. 7, 2020

(86) PCT No.: PCT/EP2020/074981
§ 371 (c)(1),
(2) Date: Mar. 4, 2022

(87) PCT Pub. No.: WO2021/044062
PCT Pub. Date: Mar. 11, 2021

(65) Prior Publication Data
US 2022/0322559 A1 Oct. 6, 2022

(30) Foreign Application Priority Data
Sep. 6, 2019 (FR) .................................. 1909850

(51) Int. Cl.
*H05K 7/14* (2006.01)
*H02M 3/00* (2006.01)
*H02M 7/00* (2006.01)

(52) U.S. Cl.
CPC .......... *H05K 7/1432* (2013.01); *H02M 3/003* (2021.05); *H02M 7/003* (2013.01)

(58) Field of Classification Search
CPC ..... H05K 7/1432; H02M 3/003; H02M 7/003
See application file for complete search history.

(56) References Cited

U.S. PATENT DOCUMENTS

| | | | |
|---|---|---|---|
| 6,501,172 B1 * | 12/2002 | Fukada | H01L 25/072 257/E23.098 |
| 2002/0186545 A1 | 12/2002 | Fukada et al. | |
| 2014/0015452 A1 | 1/2014 | Nagase et al. | |

FOREIGN PATENT DOCUMENTS

| | | | |
|---|---|---|---|
| CN | 2008-263755 A | 10/2008 | |
| EP | 2 685 796 A2 * | 1/2014 | ............... H05K 7/14 |

(Continued)

OTHER PUBLICATIONS

Japanese Office Action dated Mar. 24, 2023 in Japanese Patent Application No. 2022-514857 (submitting English translation only), 6 pages.

(Continued)

*Primary Examiner* — Mukundbhai G Patel
(74) *Attorney, Agent, or Firm* — Oblon, McClelland, Maier & Neustadt, L.L.P.

(57) ABSTRACT

Circuit board, defining a plurality of switching arms connected in parallel so as to convert a first voltage into a second voltage, at least one of which is DC voltage. The board includes a plurality of controllable electronic switches mounted pairwise in series on either side of a midpoint, so as to produce the switching arms connected in parallel. A plurality of decoupling capacitors are connected in parallel to one another, and in parallel to the DC voltage. Two electrically conductive layers are arranged parallel to one other, one of which is at the highest potential of the DC voltage and the other of which is at the lowest potential of the DC voltage. Each of the decoupling capacitors having one terminal connected to one of these electrically conduc- (Continued)

Figure 1:
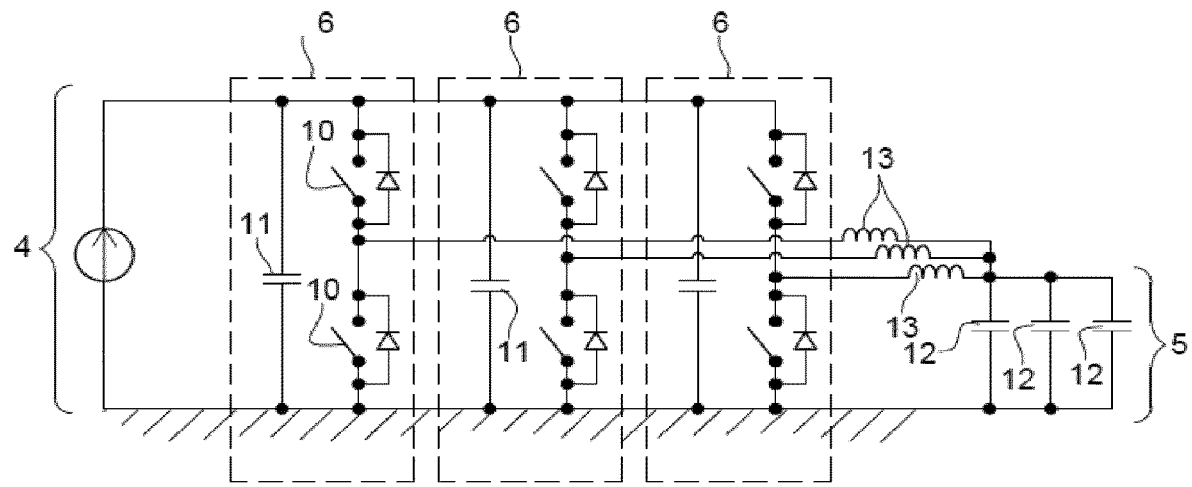

tive layers and its other terminal connected to the other of these electrically conductive layers.

20 Claims, 3 Drawing Sheets

(56) References Cited

FOREIGN PATENT DOCUMENTS

| EP | 3 312 983 A1 | 4/2018 | |
|---|---|---|---|
| EP | 3312983 A1 * | 4/2018 | .............. H02M 7/00 |
| WO | WO 2015/029630 A1 | 3/2015 | |

OTHER PUBLICATIONS

International Search Report dated Dec. 9, 2020 in PCT/EP2020/074981 filed on Sep. 7, 2020, 2 pages.

* cited by examiner

ELECTRONIC BOARD FOR VOLTAGE CONVERTER

The present invention relates to a circuit board defining a plurality of switching arms, in particular so as to produce a voltage converter. The voltage converter is, for example, a DC/DC voltage converter, or else an inverter/rectifier.

Such switching arms conventionally employ transistors. New transistor technologies based on gallium nitride (GaN) or based on silicon carbide (SiC) achieve much higher performance in terms of switching speed than previous technologies, this making it possible to work at higher chopping frequencies.

The switching arms are arranged to convert a DC voltage to another voltage, which may or may not also be a DC voltage. Decoupling capacitors are connected in parallel to this DC voltage and, because of the aforementioned chopping frequencies, high-frequency harmonics are generated. The presence of parasitic inductances in the connections between the decoupling capacitors may, because of these harmonics, generate current resonances, this possibly damaging components of the circuit board.

There is a need to have a circuit board which overcomes the aforementioned drawback.

The object of the invention is to meet this need and it does so, according to one of its aspects, using a circuit board, defining a plurality of switching arms connected in parallel so as to convert a first voltage to a second voltage, at least one of these voltages being a DC voltage, the board comprising:
  a plurality of controllable electronic switches mounted pairwise in series on either side of a midpoint, so as to produce the switching arms connected in parallel,
  a plurality of decoupling capacitors, these capacitors being connected in parallel to one another, and in parallel to the DC voltage, and
  two electrically conductive layers, one of these electrically conductive layers electrically being at the highest potential of the DC voltage and the other of these electrically conductive layers being at the lowest potential of the DC voltage, each of the decoupling capacitors having one terminal connected to one of these electrically conductive layers and its other terminal connected to the other of these electrically conductive layers,
the electronic switches being arranged on the board so that the pattern connecting all the midpoints of the switching arms defines a first polygon which has a number of sides greater than or equal to 3, and each of these two electrically conductive layers extending at least over a face superposed on the first polygon.

The circuit board according to the invention has, on the one hand, a connection between decoupling capacitors which is made via superposed electrically conductive layers, and not wired conductors or printed circuit board resistive tracks, and, on the other hand, switching arms arranged in an unaligned manner. In this way, the parasitic inductances of the connections between the decoupling capacitors, and thus the aforementioned current resonances, are significantly reduced. In addition, positioning the electronic switches on the board so that the pattern connecting all the midpoints of the switching arms defines a first polygon may make it possible to reduce the imbalance in the actual distances between the switching arms and the decoupling capacitors.

Throughout the following text, and unless explicitly stated otherwise:

the term "connected" refers to an electrical connection, whereas the term "arranged" refers to a spatial arrangement, and two polygons are of the same type when they have the same number of sides.

According to the invention, all the switching arms are arranged so as to be opposite one another spatially speaking, that is to say that no switching arm is spatially interposed between two other switching arms of the circuit board.

The electrically conductive layers may be arranged in parallel to one other.

Each electrically conductive layer may be in the form of a plate, this plate extending between two faces which are parallel to one other.

The circuit board is, for example, a printed circuit board. Each decoupling capacitor and the electronic switches are, for example, mounted on the same end face of this printed circuit board.

The first and/or the second electrically conductive layer may be arranged inside the printed circuit board. One of the electrically conductive layers is, for example, a layer defining an outer face of the printed circuit board, for example the upper face or the lower face, whereas the other electrically conductive layer is a layer arranged inside this printed circuit board.

As a variant, each of the electrically conductive layers is arranged inside the printed circuit board.

As another variant, each of the electrically conductive layers is a layer defining an outer face of the printed circuit board, one of these layers being the upper face of this printed circuit board and the other of these layers being the lower face of this printed circuit board.

Still in the case of a printed circuit board portion and when both the first and the second electrically conductive layers are arranged inside the printed circuit board portion, these two electrically conductive layers may define a high-frequency capacitor between them, having in particular a specific inductance of less than 1 nH, as disclosed in the application filed in France on Apr. 1, 2019 under the number 19 03457 by the Applicant.

The first electrically conductive layer may comprise a plurality of sublayers connected in parallel. Only some sublayers of the first electrically conductive layer, or all of these sublayers, may be arranged inside the printed circuit board. The second electrically conductive layer may comprise a plurality of sublayers connected in parallel. Only some sublayers of the second electrically conductive layer, or all of these sublayers, may be arranged inside the printed circuit board.

Where appropriate, the circuit board may comprise sublayers of the first electrically conductive layer alternating with sublayers of the second electrically conductive layer, these sublayers then being stacked.

Throughout the preceding text, and in particular when at least one of the electrically conductive layers is arranged inside a printed circuit board, one or more vias may be formed so as to make it possible to electrically connect a terminal of a capacitor to the corresponding electrically conductive layer. Each via is, for example, formed by a metallized hole or by a laser via.

Each controllable electronic switch of a switching arm may occupy either a position far from the center of the first polygon with respect to the midpoint of said arm or a position close to the center of the first polygon with respect to said midpoint.

Throughout the preceding text, the decoupling capacitors may be arranged on the board so that the pattern connecting all these capacitors defines a second polygon. The number of sides of this second polygon may be greater than or equal to three.

The number of decoupling capacitors may be equal to the number of switching arms, in which case the first polygon and the second polygon are of the same type.

The second polygon may be contained inside, or at least predominantly inside, the first polygon, or the first polygon may be contained inside, or at least predominantly inside, the second polygon. The fact that the second polygon is wholly or partially inside the first polygon may make it possible to reduce the actual distances between the decoupling capacitors associated with the pattern defining this second polygon. This position may, in addition, increase the value of the mutual inductance between these decoupling capacitors pairwise.

According to a particular exemplary implementation of the invention, both the first voltage and the second voltage may be a DC voltage. The first DC voltage may be greater than the second DC voltage. The switching arms then convert, for example:
- a first voltage of 48 V to a second voltage of 12 V, and vice versa or not, or
- a first voltage with a value greater than 300 V to a second voltage of 12 V, and vice versa or not.

When the switching arms perform a DC/DC conversion, a plurality of decoupling capacitors is present and these capacitors are connected in parallel to one another, and in parallel to the first DC voltage, and a plurality of decoupling capacitors is present and these capacitors are connected in parallel to one another and in parallel to the second DC voltage, one of the pluralities of capacitors being arranged on the board so that the pattern connecting all these capacitors defines the second polygon and the other of the pluralities of capacitors being arranged on the board so that the pattern connecting all these capacitors defines a third polygon. The second and the third polygon may both have a number of sides, equal or not from the second to the third polygon, which is greater than or equal to three.

Each plurality of capacitors may comprise a number of capacitors equal to the number of switching arms, in which case the third polygon, the second polygon and the first polygon are of the same type.

Still when the switching arms perform a DC/DC conversion, the third polygon may be contained inside, or at least predominantly inside, the first polygon or the first polygon may be contained inside, or at least predominantly inside, the third polygon. The fact that the third polygon is wholly or partially inside the first polygon may make it possible to reduce the actual distances between the decoupling capacitors associated with the pattern defining the third polygon.

When each of the aforementioned polygons is arranged inside another of these polygons, reference will be made to a nested configuration of the decoupling capacitors with respect to the controllable electronic switches.

Still when the switching arms perform a DC/DC conversion, the second polygon may be contained inside, or at least predominantly inside, the first polygon, and the first polygon may be contained inside, or at least predominantly inside, the third polygon. Such relative positions of the first, second and third polygon may be particularly advantageous for very high chopping frequencies, for example greater than 1 MHz.

Throughout the preceding text, the circuit board may comprise a plurality of inductors, each inductor being associated with a switching arm and electrically connected to the midpoint of said arm. The inductors may or may not be arranged on the board so that the pattern connecting all these inductors defines a fourth polygon. As a variant, the pattern connecting all these inductors defines a line.

The number of inductors may be equal to the number of switching arms, in which case the fourth polygon is of the same type as the first polygon. These inductors are, for example, borne by the same face of the circuit board as the decoupling capacitors and the electronic switches.

The fourth polygon may be contained inside, or at least predominantly inside, the first polygon, or the first polygon may be contained inside, or at least predominantly inside, the fourth polygon.

Still in the case where the switching arms perform a DC/DC conversion, the first DC voltage may be defined between a first positive potential and ground, and the second DC voltage may be defined between a second positive potential and ground, and the circuit board then comprises:
- a first electrically conductive layer at the first electric potential,
- a second electrically conductive layer at the second electric potential, and
- a third electrically conductive layer at ground, at least two of the electrically conductive layers, the first and the second electrically conductive layer, and in particular all the electrically conductive layers, extending at least over a face superposed on the first polygon, or
at least two of said electrically conductive layers, in particular the first and the second electrically conductive layer, extending at least over a face superposed on the first and on the second and on the third polygon.

Everything which has been stated above in relation to the arrangement of the first and of the second electrically conductive layer inside a printed circuit board or otherwise or in the form of a plurality of sublayers still applies when there are three electrically conductive layers.

The DC voltages may have an insulated ground, in which case two third electrically conductive layers insulated from one another are provided, one forming the ground of the first DC voltage, and the other forming the ground of the second DC voltage. In that case, the circuit board may comprise a first region in which the first electrically conductive layer and the third electrically conductive layer forming the ground of the first DC voltage are superposed, and a second region of the board, distinct from the first region, in which the second electrically conductive layer and the third electrically conductive layer forming the ground of the second DC voltage are superposed.

In the case where three electrically conductive layers are provided, one of the first, second, third and fourth polygons may contain all the other polygons, and at least two of the electrically conductive layers, in particular the first and the second electrically conductive layer, and in particular all the electrically conductive layers, may extend at least over a face superposed on this polygon inside which all the other polygons are arranged.

Whatever the number of conductive layers provided, one polygon may contain all the capacitors, the inductors and controllable electronic switches of the set of switching arms and at least two of the electrically conductive layers, in particular the first and the second electrically conductive layer, and in particular all the electrically conductive layers, may extend at least over a face superposed on this polygon. In the case where three electrically conductive layers are provided, each capacitor of the plurality of capacitors defining the second polygon may have one terminal electrically connected to the first electrically conductive layer and its other terminal electrically connected to the third electrically conductive layer, and each capacitor of the plurality of capacitors defining the third polygon may have one terminal electrically connected to the second electrically conductive layer and its other terminal electrically connected to the third electrically conductive layer.

Where appropriate, two capacitors arranged in parallel to the same DC voltage may have their corresponding terminals electrically connected in opposite ways, that is to say that one of these two capacitors has its first terminal electrically connected to the first electrically conductive layer and its second terminal connected to the third electrically conductive layer, whereas the other of these two capacitors has its first terminal electrically connected to the third electrically conductive layer and its second terminal connected to the first electrically conductive layer, according to the teaching of the application filed on Apr. 1, 2019 in France by the present Applicant with the filing number 19 08805, the content of which is incorporated by reference into the present application.

Throughout the preceding text, each electrically conductive layer may be produced from copper, being, for example, a copper plate.

Throughout the preceding text, the various electrically conductive layers may be arranged spatially parallel to one another.

Throughout the preceding text, each controllable switch may be a transistor using gallium nitride (GaN) or silicon carbide (SiC) or silicon.

Throughout the preceding text, there may be any number of switching arms, provided that it is greater than or equal to 3, being, for example, between 3 and 6.

Another subject of the invention, according to another of its aspects, is a voltage converter, in particular a DC/DC voltage converter, and in particular a 12 V/48 V or 12 V/greater-than-300 V voltage DC voltage converter, comprising a circuit board as defined above.

As a variant, the voltage converter is an inverter/rectifier, in which case the DC voltage has, for example, a value of 12 V or of 48 V or a value greater than 300 V.

The voltage converter may make it possible to charge a DC voltage source from an AC voltage network.

Figure 2:
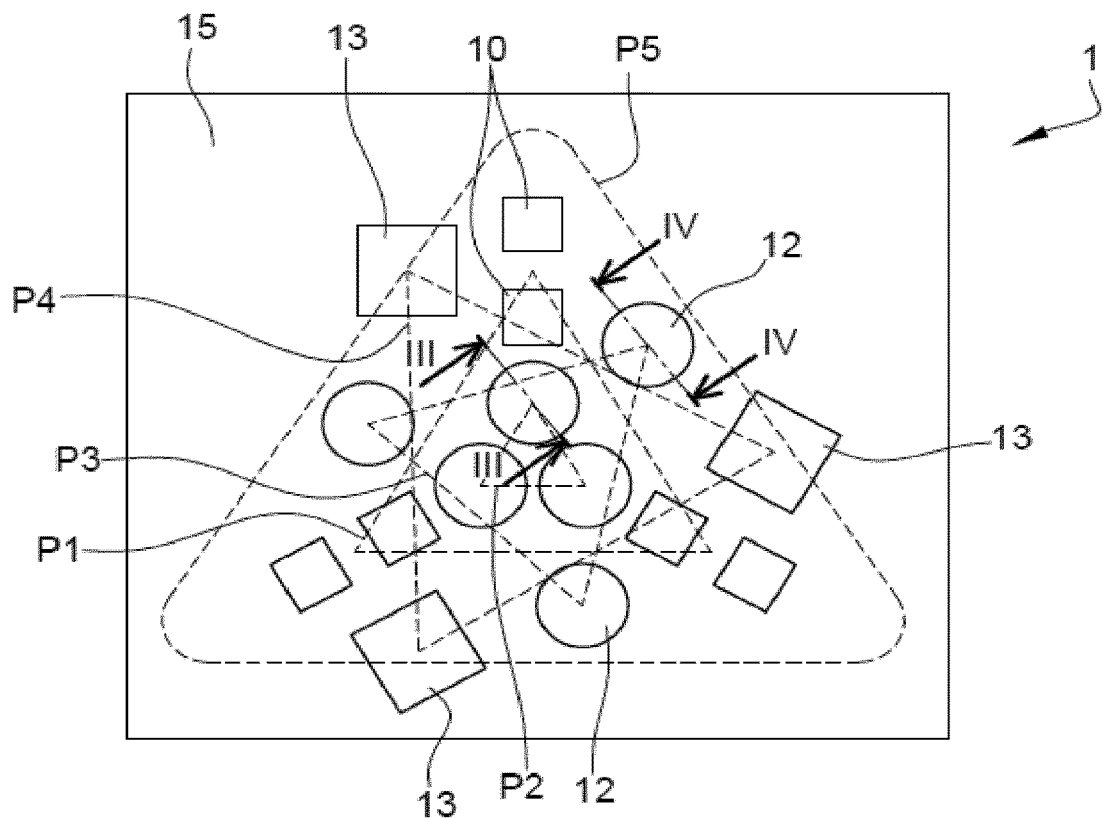
Figure 3:
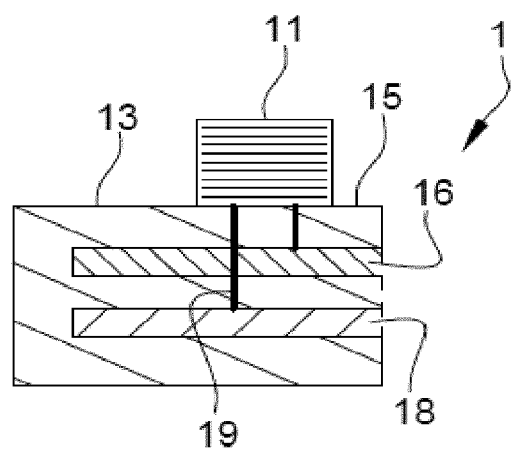
Figure 4:
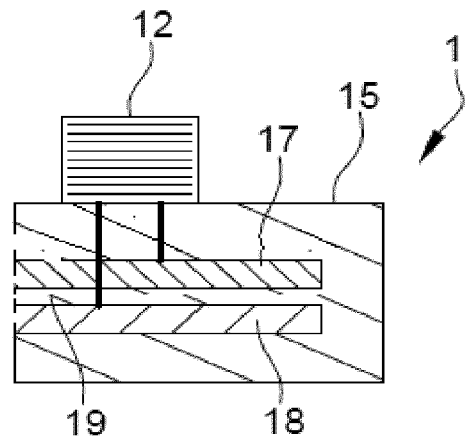
Figure 5:
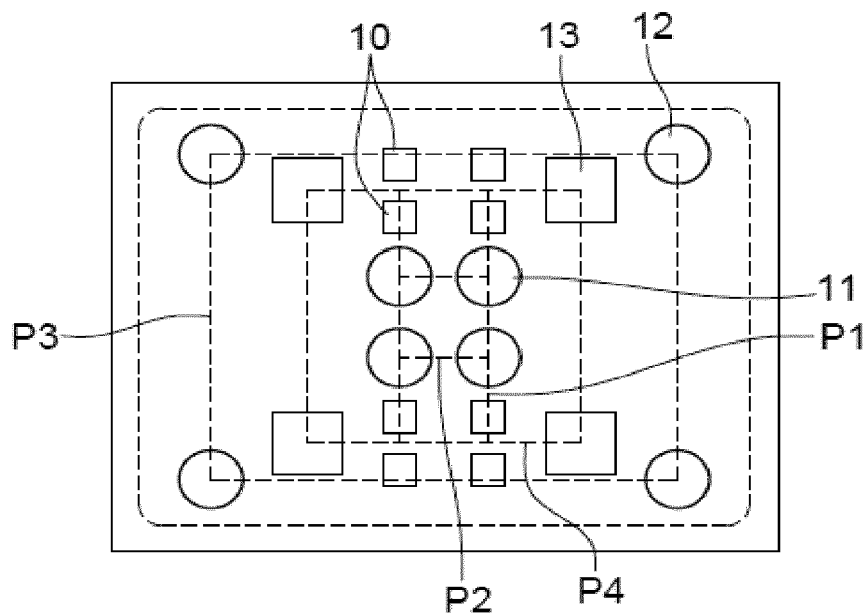
Figure 6:
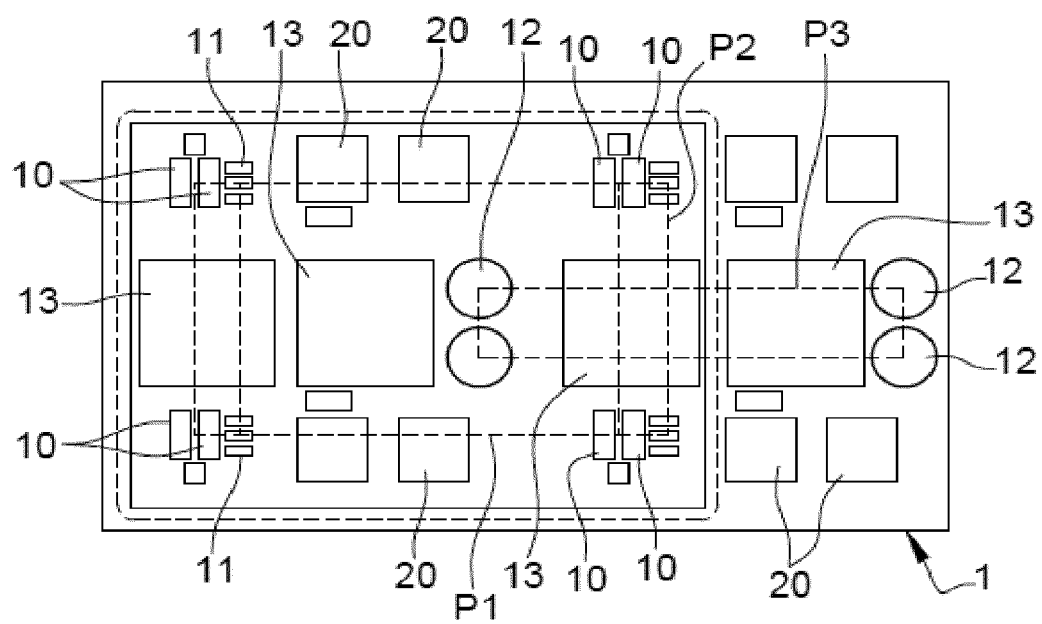

The invention may be better understood on reading the following description of non-limiting exemplary implementations thereof and on examining the appended drawing, in which:

FIG. 1 shows the circuit diagram of a circuit formed by a circuit board according to one exemplary implementation of the invention, FIG. 2 shows a top view of a circuit board according to the example of FIG. 1, FIG. 3 is a partial cross section along III-III of the circuit board of FIG. 2, FIG. 4 is a partial cross section along IV-IV of the circuit board of FIG. 2, and FIGS. 5 and 6 show, similarly to FIG. 2, circuit boards according to other exemplary implementations of the invention.

FIG. 1 shows the electrical circuit borne by a circuit board 1 according to one exemplary implementation of the invention. This circuit board 1 forms in this instance part of a voltage converter which is, in the example under consideration, a DC/DC voltage converter. It is, for example, a 12 V/48 V voltage converter, but the invention is not limited to such an example. The circuit board 1 is in this instance a printed circuit board.

In a known manner, the voltage converter comprises in this instance a first DC voltage input 4, a second DC voltage input 5 and a plurality of switching arms 6 making it possible to convert the voltage value at the first DC voltage input 4 to another voltage value available at the second DC voltage input 5, and vice versa. The number of switching arms 6 is greater than or equal to three, being in this instance exactly equal to three.

Each switching arm 6 comprises, in the example under consideration, two controllable electronic switches 10 which are connected in series and which define a midpoint between them connected to the second voltage input 5.

Each controllable switch 10 is in this instance a MOSFET, using, for example, gallium nitride, silicon carbide or silicon.

The electronic component 1 further comprises:
a first plurality of decoupling capacitors 11, these capacitors 11 all being connected in parallel, and in parallel to the switching arm 6, and
a second plurality of decoupling capacitors 12, these capacitors all being connected in parallel, and in parallel to the second DC voltage input 5.

The capacitors 11 and the capacitors 12 are, for example, of the same type, namely in particular chemical capacitors or ceramic capacitors.

It may further be observed in FIG. 1 that the electrical circuit further comprises a plurality of inductors 13, each inductor being associated with a switching arm 6 and electrically connected between the midpoint of the arm 6 with which it is associated and the highest potential of the second DC voltage.

In the example under consideration, there are as many capacitors 11 as there are capacitors 12, and as there are inductors 13, this common value being equal to the number of switching arms 6. The invention is not, however, limited to such a common value for the aforementioned components.

As may be seen in FIG. 2, the capacitors 11, the capacitors 12, the inductors 13 and the controllable electronic switches 10 are mounted, in the example under consideration, on an outer face 15 of the circuit board 1.

The circuit board 1 receives, in the example of FIG. 2, three electrically conductive layers, respectively being:
a first electrically conductive layer 16 at the highest potential of the first DC voltage, also called the "first positive potential" and which is in this instance 48 V,
a second electrically conductive layer 17 at the highest potential of the second DC voltage, also called the "second positive potential" and which is in this instance 12 V, and
a third electrically conductive layer 18 at ground, this ground being in this instance common to the first DC voltage and to the second DC voltage.

In a variant which is not described, the first DC voltage and the second DC voltage have insulated grounds, in which case two third electrically conductive layers 18 which are not connected to one another are provided, one of these third electrically conductive layers forming the ground of the first DC voltage and the other of these third electrically conductive layers forming the ground of the second DC voltage.

The capacitors 11 each have, in the example under consideration, one terminal electrically connected to the first electrically conductive layer 16 and one terminal electrically connected to the third electrically conductive layer 18, as shown in FIG. 3, in which the second electrically conductive layer 17 has been omitted for the sake of the clarity of the drawing.

The capacitors 12 each have, in the example under consideration, one terminal electrically connected to the second electrically conductive layer 17 and one terminal electrically connected to the third electrically conductive layer 18, as shown in FIG. 4, in which the first electrically conductive layer 16 has been omitted for the sake of the clarity of the drawing.

It may be observed that, in the example under consideration, the first electrically conductive layer 16 extends in planes which are parallel to the planes in which the second electrically conductive layer 17 extends, and also parallel to the planes in which the third electrically conductive layer 18 extends. Each of these layers 16, 17 and 18 is formed in this instance by a copper plate. Each of these layers 16, 17 and 18 is also arranged inside the circuit board 1, and a capacitor terminal is in this instance connected to the corresponding electrically conductive layer by means of a via 19, which is a metallized hole.

In the examples which will now be described, the switching arms 6, and therefore their electronic switches 10, are arranged on the board 1 so that the pattern connecting all the midpoints of the switching arms 6 defines a first polygon P1 which has a number of sides greater than or equal to 3, and each electrically conductive layer 16, 17 and 18 extends at least over a face superposed on the first polygon.

In the example of FIG. 2, this first polygon is a triangle, whereas it is a quadrilateral in the examples of FIGS. 5 and 6.

It may be observed in FIG. 2 that, for a given switching arm 6, one of the controllable electronic switches 10 is arranged outside the first polygon P1, whereas the other controllable electronic switch 10 is arranged inside this first polygon P1.

It may also be observed that the capacitors 11 associated with the first DC voltage input 4 are arranged on the board 1 so that the pattern connecting all these capacitors 11 defines a second polygon P2, this second polygon P2 being in this instance a triangle.

It may be observed in FIG. 2 that this second polygon P2 is arranged inside the first polygon P1.

Still in the example of FIG. 2, the capacitors 12 associated with the second DC voltage input 5 are arranged on the board 1 so that the pattern connecting all these capacitors 12 defines a third polygon P3, this third polygon P3 also being in this instance a triangle. It may be observed in FIG. 2 that the third polygon P3 extends in some parts inside the first polygon P1 and in other parts outside this first polygon P1. In the example of FIG. 2, the third polygon P3 extends predominantly inside the first polygon P1.

In addition, in the example of FIG. 2, the inductors 13 are arranged on the board 1 so that the pattern connecting all these inductors 13 defines a fourth polygon P4, the fourth polygon also being in this instance a triangle. It may be observed that this fourth polygon extends in some parts inside the first polygon P1 and in some parts outside this polygon P1.

Each of the electrically conductive layers 16, 17 and 18 extends, in the example described, over a face superposed on the polygon P5 in which the components 10, 11, 12 and 13 of the board are arranged, all the polygons P1 to P4 being arranged inside this polygon P5.

In the example of FIGS. 5 and 6, four switching arms 6 are present, four capacitors 11 are associated with the first DC voltage input 4, and four capacitors 12 and four inductors 13 are associated with the second DC voltage input 5.

The presence of a first polygon P1, second polygon P2, third polygon P3 and fourth polygon P4, which are in this instance quadrilaterals, may also be observed here.

In the example of FIG. 5, the second polygon P2, which relates to the capacitors 11 associated with the first DC voltage input 4, is arranged inside the first polygon P1, this first polygon P1 itself being arranged inside the fourth polygon P4, which relates to the inductors 13, and this fourth polygon P4 being arranged inside the third polygon P3, which relates to the capacitors 12 associated with the second DC voltage input 5. Positioning the capacitors 11 as much on the inside as possible makes it possible to increase the value of the mutual inductance between these capacitors 11 pairwise.

FIG. 6 depicts another exemplary circuit board 1, in which the polygons P1 to P3 are also quadrilaterals. In contrast to the preceding examples, the inductors 13 are not connected by a pattern defining a polygon but by a line. It may be observed, in addition, that none of the polygons P1, P2 and P3 is contained inside another polygon, the polygon P1 overlapping with the polygon P2 and the polygon P3 overlapping with both the polygon P1 and the polygon P2. It may also be observed in FIG. 6 that safety transistors 20 are borne by the circuit board 1.

The invention is not limited to the examples which have just been described.

The invention claimed is:

1. A circuit board, defining a plurality of switching arms connected in parallel so as to convert a first voltage to a second voltage, at least one of these voltages being a DC voltage, the board comprising:
    a plurality of controllable electronic switches mounted pairwise in series on either side of a midpoint, so as to produce the switching arms connected in parallel,
    a plurality of decoupling capacitors, these capacitors being connected in parallel to one another, and in parallel to the DC voltage, and
    two electrically conductive layers, in particular arranged parallel to one other, one of these electrically conductive layers electrically being at the highest potential of the DC voltage and the other of these electrically conductive layers being at the lowest potential of the DC voltage, each of the decoupling capacitors having one terminal connected to one of these electrically conductive layers and its other terminal connected to the other of these electrically conductive layers,
    the electronic switches being arranged on the board so that the pattern connecting all the midpoints of the switching arms defines a first polygon which has a number of sides greater than or equal to 3, and each of the two electrically conductive layers extending at least over a face superposed on the first polygon.

2. The circuit board as claimed in claim 1, each controllable electronic switch of a switching arm occupying either a position far from the center of the first polygon with respect to the midpoint of said arm or a position close to the center of the first polygon with respect to said midpoint.

3. The circuit board as claimed in claim 2, the decoupling capacitors being arranged on the board so that the pattern connecting all these capacitors defines a second polygon, this second polygon being in particular of the same type as the first polygon.

4. The circuit board as claimed in claim 2, both the first voltage and the second voltage being a DC voltage, the first DC voltage being in particular greater than the second DC voltage.

5. A voltage converter, in particular a DC/DC voltage converter, and in particular a 12 V/48 V DC voltage converter, comprising a circuit board as claimed in claim 2.

6. The circuit board as claimed in claim 1, the decoupling capacitors being arranged on the board so that the pattern connecting all these capacitors defines a second polygon, this second polygon being in particular of the same type as the first polygon.

7. The circuit board as claimed in claim 6, the second polygon being contained inside, or at least predominantly inside, the first polygon, or the first polygon being contained inside, or at least predominantly inside, the second polygon.

8. The circuit board as claimed in claim 1, both the first voltage and the second voltage being a DC voltage, the first DC voltage being in particular greater than the second DC voltage.

9. The circuit board as claimed in claim 8, comprising a plurality of decoupling capacitors connected in parallel to one another, and in parallel to the first DC voltage, and a plurality of decoupling capacitors connected in parallel to one another and in parallel to the second DC voltage, one of the pluralities of capacitors being arranged on the board so that the pattern connecting all these capacitors defines the second polygon and the other of the pluralities of capacitors being arranged on the board so that the pattern connecting all these capacitors defines a third polygon, the third polygon being in particular of the same type as the first and the second polygon.

10. The circuit board as claimed in claim 9, the third polygon being contained inside, or at least predominantly inside, the first polygon, or the first polygon being contained inside, or at least predominantly inside, the third polygon.

11. The circuit board as claimed in claim 10, comprising a plurality of inductors, each inductor being associated with a switching arm and electrically connected to the midpoint of said arm, the inductors being arranged on the board so that the pattern connecting all these inductors defines a fourth polygon, the fourth polygon being in particular of the same type as the first polygon.

12. The circuit board as claimed in claim 10, the first DC voltage being defined between a first positive potential and ground, and the second DC voltage being defined between a second positive potential and ground, the board comprising:
  a first electrically conductive layer at the first electric potential,
  a second electrically conductive layer at the second electric potential, and
  a third electrically conductive layer at ground,
  at least two of the electrically conductive layers, in particular all the electrically conductive layers, extending at least over a face superposed on the first polygon.

13. The circuit board as claimed in claim 9, the second polygon being contained inside, or at least predominantly inside, the first polygon, and the first polygon being contained inside, or at least predominantly inside, the third polygon.

14. The circuit board as claimed in claim 9, comprising a plurality of inductors, each inductor being associated with a switching arm and electrically connected to the midpoint of said arm, the inductors being arranged on the board so that the pattern connecting all these inductors defines a fourth polygon, the fourth polygon being in particular of the same type as the first polygon.

15. The circuit board as claimed in claim 14, one of the first, second, third and fourth polygons containing all the other polygons, and at least two of the electrically conductive layers, in particular all the electrically conductive layers, extending at least over a face superposed on this polygon inside which all the other polygons are arranged.

16. The circuit board as claimed in claim 15, each capacitor of the plurality of capacitors defining the second polygon having one terminal electrically connected to the first electrically conductive layer and its other terminal electrically connected to the third electrically conductive layer, and each capacitor of the plurality of capacitors defining the third polygon having one terminal electrically connected to the second electrically conductive layer and its other terminal electrically connected to the third electrically conductive layer.

17. The circuit board as claimed in claim 9, the first DC voltage being defined between a first positive potential and ground, and the second DC voltage being defined between a second positive potential and ground, the board comprising:
  a first electrically conductive layer at the first electric potential,
  second electrically conductive layer at the second electric potential, and
  a third electrically conductive layer at ground,
  at least two of the electrically conductive layers, in particular all the electrically conductive layers, extending at least over a face superposed on the first polygon.

18. The circuit board as claimed in claim 17 , each capacitor of the plurality of capacitors defining the second polygon having one terminal electrically connected to the first electrically conductive layer and its other terminal electrically connected to the third electrically conductive layer, and each capacitor of the plurality of capacitors defining the third polygon having one terminal electrically connected to the second electrically conductive layer and its other terminal electrically connected to the third electrically conductive layer.

19. The circuit board as claimed in claim 17, one of the first, second, third and fourth polygons containing all the other polygons, and at least two of the electrically conductive layers, in particular all the electrically conductive layers, extending at least over a face superposed on this polygon inside which all the other polygons are arranged.

20. A voltage converter, in particular a DC/DC voltage converter, and in particular a 12 V/48 V DC voltage converter, comprising a circuit board as claimed in claim 1.

* * * * *